United States Patent
Kang

(10) Patent No.: US 11,378,459 B2
(45) Date of Patent: Jul. 5, 2022

(54) INFRARED SENSOR STRUCTURE

(71) Applicant: SHANGHAI IC R&D CENTER CO., LTD., Shanghai (CN)

(72) Inventor: Xiaoxu Kang, Shanghai (CN)

(73) Assignee: SHANGHAI IC R&D CENTER CO., LTD, Shanghai (CN)

( * ) Notice: Subject to any disclaimer, the term of this patent is extended or adjusted under 35 U.S.C. 154(b) by 20 days.

(21) Appl. No.: 16/961,955

(22) PCT Filed: Aug. 29, 2018

(86) PCT No.: PCT/CN2018/102892
§ 371 (c)(1),
(2) Date: Jul. 14, 2020

(87) PCT Pub. No.: WO2019/179046
PCT Pub. Date: Sep. 26, 2019

(65) Prior Publication Data
US 2021/0055163 A1    Feb. 25, 2021

(30) Foreign Application Priority Data

Mar. 20, 2018   (CN) .......................... 201810230944.6

(51) Int. Cl.
*G01J 5/02*    (2022.01)
*G01J 5/08*    (2022.01)
(Continued)

(52) U.S. Cl.
CPC ............ *G01J 5/024* (2013.01); *B81B 3/0081* (2013.01); *G01J 5/0853* (2013.01); *G01J 5/38* (2013.01);
(Continued)

(58) Field of Classification Search
CPC . G01J 5/024; G01J 5/0853; G01J 5/38; H01L 31/024; H01L 31/101; B81B 3/0081; H01H 37/72; H01H 2037/008
See application file for complete search history.

(56) References Cited

U.S. PATENT DOCUMENTS

| | | | |
|---|---|---|---|
| 9,163,998 B2 * | 10/2015 | Nam ..................... | G01J 5/0818 |
| 10,643,810 B2 * | 5/2020 | Rinaldi ................. | H01H 37/02 |
| 2009/0262778 A1 * | 10/2009 | Ikushima ............... | G01J 5/02 |
| | | | 374/121 |

FOREIGN PATENT DOCUMENTS

| | | | | |
|---|---|---|---|---|
| CN | 102480285 A | * | 5/2012 | ............. H03K 17/78 |
| JP | H01108943 U | * | 7/1989 | ............. H01L 23/36 |

OTHER PUBLICATIONS

Liu et al.—CN 102480285 A—Google Patents English obtained Dec. 9, 2021 (Year: 2021).*

* cited by examiner

*Primary Examiner* — David P Porta
*Assistant Examiner* — Jeremy S Valentiner
(74) *Attorney, Agent, or Firm* — Tianchen LLC.; Yuan R. Li; Yi Fan Yin

(57) ABSTRACT

The present disclosure discloses an infrared sensor structure, comprises a cantilever switch array, the cantilever switch array comprises cantilever switches, and each cantilever switch comprises a cantilever beam and a switch corresponding to the cantilever beam, vertical heights from the cantilever beams to the switches in different cantilever switches are different from each other, when the cantilever beams are deformed towards the switches and connect to the switches, the switches turn on; wherein, deformations of different cantilever beams produced by absorbing infrared signal are different from each other, the intensity of the infrared signal can be quantified by number of the switches (Continued)

on, so as to realize detection of the infrared signal. The manufacturing of the infrared sensor structure in the present disclosure can be compatible with the existing semiconductor CMOS process.

9 Claims, 4 Drawing Sheets

(51) Int. Cl.
*G01J 5/38* (2006.01)
*H01H 1/00* (2006.01)
*H01H 37/00* (2006.01)
*H01L 31/024* (2014.01)
*H01L 31/101* (2006.01)
*B81B 3/00* (2006.01)
*H01H 37/72* (2006.01)

(52) U.S. Cl.
CPC .......... *H01H 1/0036* (2013.01); *H01H 37/72* (2013.01); *H01L 31/024* (2013.01); *H01L 31/101* (2013.01); *H01H 2037/008* (2013.01)

INFRARED SENSOR STRUCTURE

CROSS-REFERENCE TO RELATED APPLICATION

This application claims priority of International Patent Application Serial No. PCT/CN2018/102892, filed Aug. 29, 2018, which is related to and claims priority of Chinese patent application Serial No. 201810230944.6, filed Mar. 20, 2018. The entirety of each of the above-mentioned patent applications is hereby incorporated herein by reference and made a part of this specification.

TECHNICAL FIELD

The present disclosure relates to the field of semiconductor integrated circuit and infrared sensor technology, in particular to an infrared sensor structure compatible with CMOS (Complementary Metal Oxide Semiconductor).

BACKGROUND

MEMS (Micro-Electro-Mechanical System) has many advantages, such as micro, intelligent, executable, integrated, process compatibility, low cost, etc., so it has been widely used in many fields, such as infrared detection technology.

Infrared sensor is a kind of product that widely used in the field of infrared detection technology. Generally, it adopts a MEMS micro-bridge structure integrated on a CMOS circuit, a thermistor (usually amorphous silicon or vanadium oxide with negative temperature coefficient) is utilized to absorb infrared light, and a circuit is used to convert changed signal into electrical signal, then amplify and output, so as to realize thermal imaging function.

In micro-bridge structure of existing infrared sensor, bridge of the micro-bridge structure usually includes a negative sensitive layer (a thermal sensitive material) with negative temperature coefficient and a metal electrode layer. Absorption of infrared light by the negative sensitive layer leads to resistance change, two supporting columns at both ends of the bridge of the micro-bridge are connected by the metal electrode layer, and then electrically connected to a peripheral readout circuit by the supporting columns, resistance signal of the negative sensitive material layer is changed into electrical signal, then amplify and output, so as to realize thermal imaging function.

However, the process compatibility between MEMS and CMOS is the key problem to the technology of CMOS-MEMS.

Therefore, based on the existing semiconductor CMOS technology, how to improve the structure and manufacturing technology of infrared sensor has become an important issue.

SUMMARY

The technical problem to be solved by the present disclosure is to provide an infrared sensor structure.

In order to achieve the above purpose, the present disclosure provides an infrared sensor structure, comprises a cantilever switch array, the cantilever switch array comprises cantilever switches, and each cantilever switch comprises a cantilever beam and a switch corresponding to the cantilever beam, vertical heights from the cantilever beams to the switches in different cantilever switches are different from each other, when the cantilever beams are deformed towards the switches and connect to the switches, the switches turn on; wherein, deformations of different cantilever beams produced by absorbing infrared signal are different from each other, the intensity of the infrared signal can be quantified by number of the switches turned on.

Further, the switch is a metal switch or a CMOS switch, and the end of the cantilever beam comprises a metal for controlling the switch.

Further, the cantilever switch array is built on a semiconductor substrate, the switch is set on the surface of the semiconductor substrate, and each cantilever beam is horizontally connected to side of a supporting column arranged on the surface of the semiconductor substrate.

Further, the cantilever beam comprises a metal layer, and the metal layer is separated from the switch, a pressure-controlled heat sink is set on the semiconductor substrate, the pressure-controlled heat sink is connected to the metal layer and controlled by a voltage for dissipating heat generated on the cantilever beam.

Further, the material of the supporting column is a dielectric material.

Further, a thermal isolating layer is set between the cantilever beam and a supporting column, and the thermal isolating layer is also set between the cantilever beam and the switch.

Further, the structure of the cantilever beam is laminated structure, and the cantilever beam comprises an infrared absorptive layer, a first thermal deformed layer and a second thermal deformed layer; wherein, the width of the infrared absorptive layer is larger than the width of either the first thermal deformed layer or the second thermal deformed layer.

Further, in the cantilever switch array, the material of the infrared absorptive layer is a dielectric material; the materials of the first thermal deformed layer and the second thermal deformed layer in same cantilever beam are thermal sensitive materials with different thermal expansion coefficients; the thermal expansion coefficients of the first thermal deformed layers in different cantilever beams are different, and the thermal expansion coefficients of the second thermal deformed layers in different cantilever beams are different.

Further, in the cantilever switch array, the vertical heights from the cantilever beams to the corresponding switches are set to increase or decrease successively.

Further, in the cantilever switch array, when the vertical heights from the cantilever beams to the corresponding switches are set to increase successively, the thermal expansion coefficients of the materials of the cantilever beams increase successively; when the vertical heights from the cantilever beams to the corresponding switches are set to decrease successively, the thermal expansion coefficients of the materials of the cantilever beams decrease successively.

The beneficial effects of the present disclosure are as follows:

The present disclosure provides an infrared sensor structure, comprises a cantilever switch array, vertical heights from cantilever beams to switches in different cantilever switches are different from each other, when the cantilever beams are deformed by absorbing infrared signal, deformations of different cantilever beams are different from each other, with the deformation characteristic, the intensity of the infrared signal can be quantified by the conducting state of the switches, so as to realize the detection of the infrared signal. Wherein, the present disclosure provides a thermal isolating layer, which is set between the cantilever beam and a supporting column and between the cantilever beam and the switch, when the cantilever beams absorb the infrared signal, the thermal isolating layer prevents heat to be dissipated by metal switches or semiconductor substrate. The structure of the cantilever beam is laminated structure, and the cantilever beam comprises an infrared absorptive layer, a first thermal deformed layer and a second thermal deformed layer; wherein, the width of the infrared absorptive layer is larger than the width of either the first or the second thermal deformed layer, so as to facilitate the deformation and sensitivity of the cantilever beam. Infrared absorption is enhanced by setting a reflective layer under the cantilever switch array. The cantilever beam comprises a metal layer, beneficial effects are as follows: a) balancing heat generated on the cantilever beams; b) when external infrared signal changes rapidly, after a previous data is output, a next data needs to be initialized before output, by setting a pressure-controlled heat sink, the pressure-controlled heat sink is connected to the cantilever beams by a voltage and dissipates heat generated on the cantilever beams. The manufacturing of the infrared sensor structure in the present disclosure can be compatible with existing semiconductor CMOS process.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the disclosure as recited in the appended claims.

It is to be understood that "first," "second" and similar terms used in the specification and claims are not to represent any sequence, number or importance but only to distinguish different parts. Likewise, similar terms such as "a" or "an" also do not represent a number limit but represent "at least one". It is also to be understood that term "and/or" used in the present disclosure refers to and includes one or any or all possible combinations of multiple associated items that are listed.

The content of the present disclosure will be further described in detail below in conjunction with the accompanying drawings of the specification. It should be understood that the present disclosure can have various changes on different examples, all of which do not depart from the scope of the present disclosure, and the descriptions and illustrations therein are essentially for illustrative purposes, rather than to limit the present disclosure. It should be noted that the drawings are in a very simplified form and all use inaccurate ratios, which are only used to conveniently and clearly assist the purpose of explaining the embodiments of the present disclosure.

Figure 1:
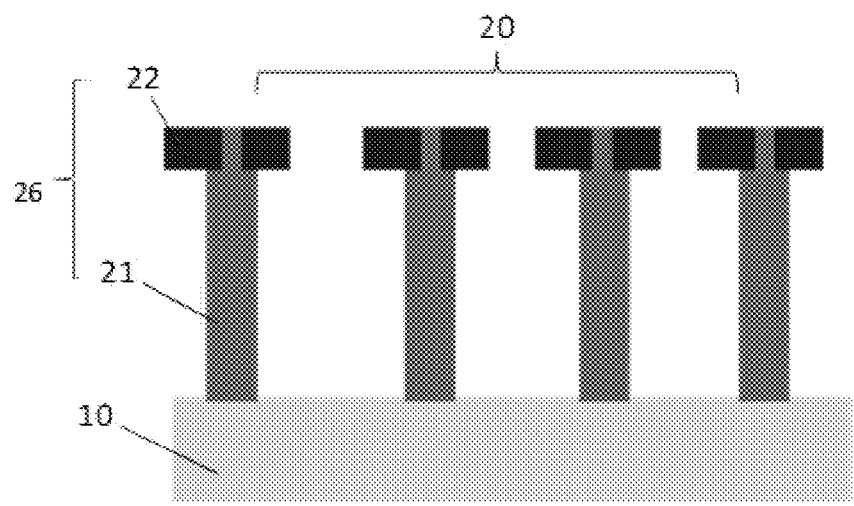
FIG. 1 is a top view of an infrared sensor structure according to a preferred embodiment of the present invention
Figure 2:
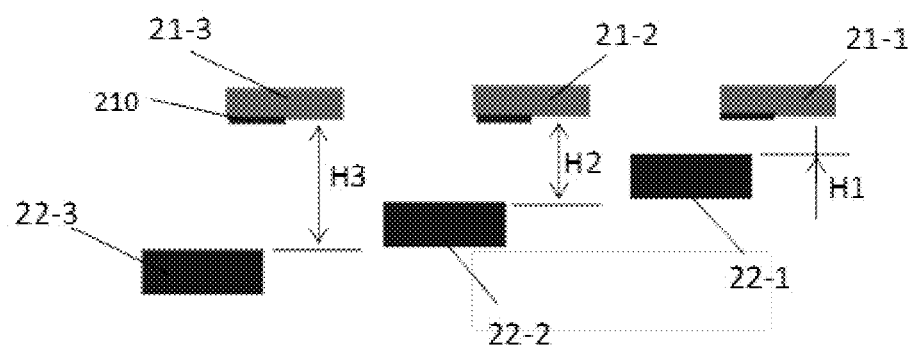
FIG. 2 is a sectional view of a local structure of a cantilever switch array according to a preferred embodiment 1 of the present invention

As shown in FIG. 1 and FIG. 2, FIG. 1 is a top view of an infrared sensor structure according to a preferred embodiment of the present invention, FIG. 2 is a sectional view of a local structure of a cantilever switch array according to a preferred embodiment 1 of the present invention. As shown in FIG. 1 and FIG. 2, an infrared sensor structure of the present disclosure can be built on a semiconductor substrate (not shown), the infrared sensor structure comprises a cantilever switch array 20 which composes a plurality of cantilever switches 26. The cantilever switch array 20 comprises at least two cantilever switches 26, as shown in FIG. 1, four cantilever switches 26 are illustrated.

As shown in FIG. 1, in the cantilever switch array 20, each cantilever switch 26 comprises a cantilever beam 21 on top with a switch 22 at the bottom, which corresponding to the cantilever beam 21. In the initial state, the cantilever beams 21 are separated from the switches 22 at a certain vertical height (distance). When the cantilever beams 21 are deformed (warped) towards the switches 22 and connect to the switches 22, the switches 22 turn on.

The cantilever switch array 20 is built on a semiconductor substrate. The switches 22 comprised in the cantilever switches 26 are set on the surface of the semiconductor substrate; supporting columns 10 are set vertically on the surface of the semiconductor substrate, and the cantilever beams 21 comprised in the cantilever switches 26 are horizontally connected to the side of the supporting columns 10.

The supporting columns 10 can be formed by deposition, lithography, etching and other steps with a conventional dielectric material in CMOS process.

The switches 22 are metal switches or CMOS switches formed by CMOS process.

As shown in FIG. 2, a cantilever switch array provided by the present disclosure comprises the switches 22 located on the underside of the cantilever beams 21, vertical heights from the cantilever beams 21 to the switches 22 in different cantilever switches 26 are different from each other; three cantilever switches are shown in the FIG. 2, vertical height from the cantilever beam 21-1 to the switch 22-1 is H1, vertical height from the cantilever beam 21-2 to the switch 22-2 is H2, vertical height from the cantilever beam 21-3 to the switch 22-3 is H3 and H1<H2<H3.

The cantilever beams 21 comprise thermal sensitive materials, and the thermal expansion coefficients of the thermal sensitive materials in different cantilever beams 21 are different from each other. Wherein, selection of different thermal sensitive materials should ensure that thermal expansion coefficients of different thermal sensitive materials are markedly different from each other.

Absorbing infrared signal, the cantilever beams 21 (21-1, 21-2 and 21-3) comprise thermal sensitive material are warped and deformed towards the switches 22 (22-1, 22-2 and 22-3) due to thermal deformation. When deformations are larger than vertical heights such as H1/H2/H3, the cantilever beams 21 connect to the interface of the switches 22, and then the switches 22 are turned on. The cantilever beams with different thermal expansion coefficients absorb infrared signal, the deformations of the cantilever beams are different from each other, the intensity of the infrared signal can be quantified by number of the switches turned on and absorption rate of the infrared signal can be evaluated.

The ends of the cantilever beams 21 (21-1, 21-2 and 21-3) comprise a metal 210 for controlling the switches.

In the cantilever switch array 20, the vertical heights (H1, H2, H3) from the cantilever beams (21-1, 21-2, 21-3) to the corresponding switches (22-1, 22-2, 22-3) can be set to increase successively as shown in the FIG. 2, the vertical height from the cantilever beam to the switch in each cantilever switch is set as H1<H2<H3. Alternatively, in the cantilever switch array 20, the vertical heights from the cantilever beams to the corresponding switches can be set to decrease successively.

In the cantilever switch array 20, when the vertical heights from the cantilever beams to the corresponding switches are set to increase successively, the thermal expansion coefficients of the materials of the cantilever beams increase successively; when the vertical heights from the cantilever beams to the corresponding switches are set to decrease successively, the thermal expansion coefficients of the materials of the cantilever beams decrease successively.

Figure 3:
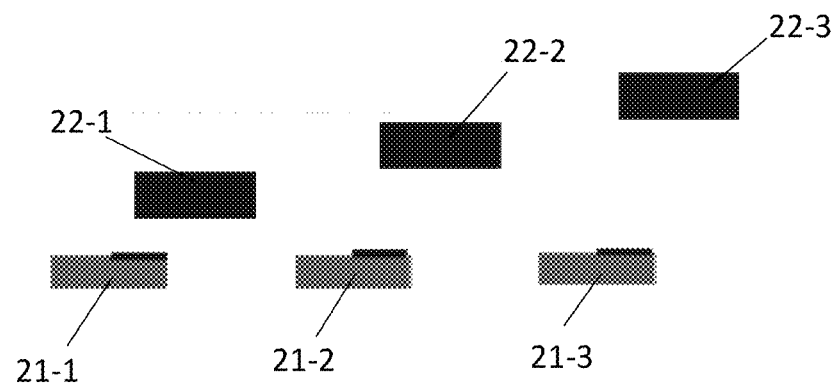
FIG. 3 is a sectional view of a local structure of a cantilever switch array according to a better embodiment 2 of the present invention

As shown in FIG. 3, it is an implementation of switches 22 (22-1, 22-2, 22-3) on the upper side of cantilever beams 21 (21-1, 21-2, 21-3). The switches 22 can be placed on the upper side or the lower side of the cantilever beams 21, mainly due to selection of the materials. When the switches 22 are placed on the upper side of the cantilever beams 21, the selection of the materials are limited in the CMOS process.

Figure 4:
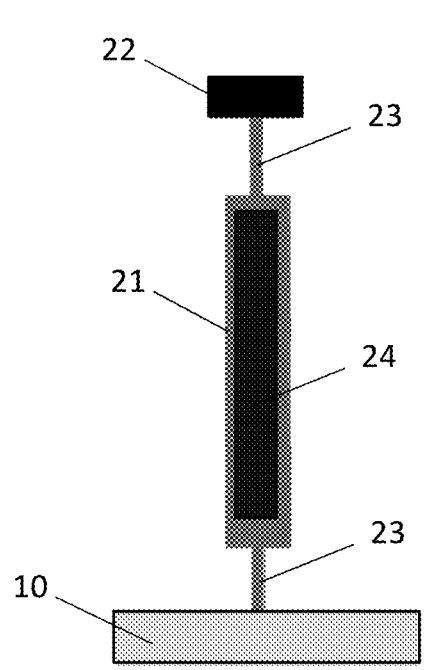
FIG. 4 is a top view of a cantilever switch structure according to a preferred embodiment of the present invention

FIG. 4 is a top view of a cantilever switch structure according to a preferred embodiment of the present invention. As shown in FIG. 4, the cantilever beams 21 comprises a thermal isolating layer 24 which is set between one end of the cantilever beams 21 and the supporting columns 10, and between the other end of the cantilever beams 21 and the switches 22 respectively, in order to prevent heat generated by infrared absorption of the cantilever beams 21 to be dissipated by the metal switches 22 or the semiconductor substrate. In order to achieve thermal isolation, the cross-sectional area of the thermal isolating layer 23 is as small as possible relative to the cross-sectional area of cantilever beams 21.

Figure 6:
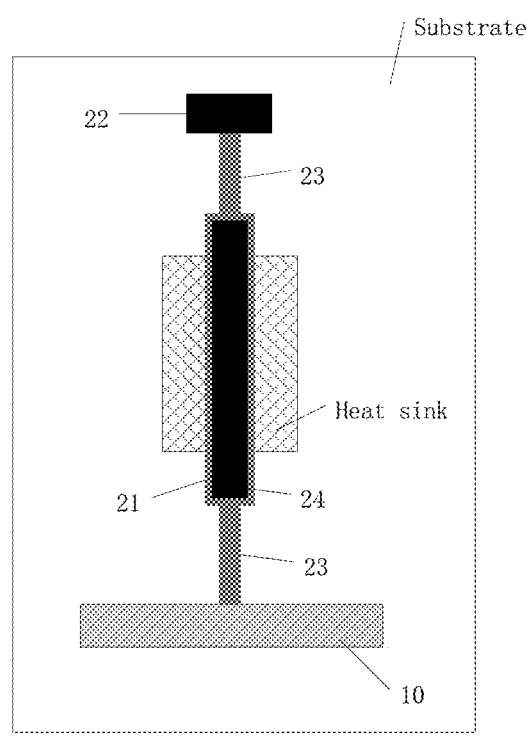
FIG. 6 is a top view of a cantilever switch structure with a heat sink according to a preferred embodiment of the present invention
Figure 7:
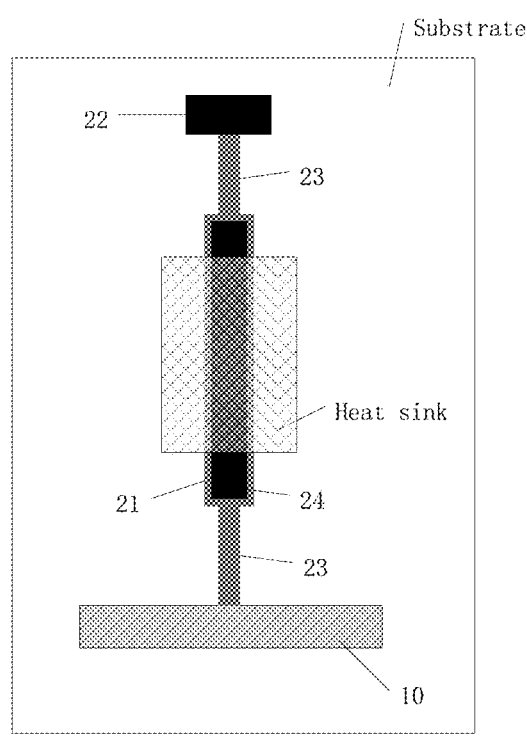
FIG. 7 is a top view of a cantilever switch structure with a heat sink according to another preferred embodiment of the present invention.

Main structural beams of the cantilever beams 21 comprise a metal layer 24, the metal layer 24 is separated from the metal switches 22 and doesn't connect to the metal switches 22. Wherein, a pressure-controlled heat sink (shown in FIG. 6 and FIG. 7) is set on the semiconductor substrate, the pressure-controlled heat sink connects to the metal layer 24 in the cantilever beams 21 by a voltage. The beneficial effects are as follows: a) balancing heat generated on the cantilever beams; b) when external infrared signal changes rapidly, after a previous data is output, a next data needs to be initialized before output, through voltage control, the pressure-controlled heat sink is connected to the cantilever beams and dissipates heat generated on the cantilever beams by conduction.

Figure 5:
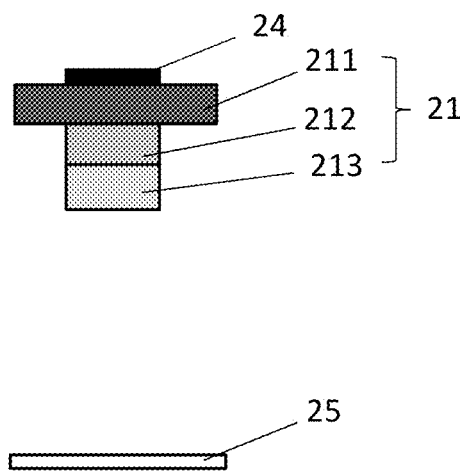
FIG. 5 is the structural section of a cantilever beam in FIG. 4

As shown in FIG. 5, which is the structural section of a cantilever beam in FIG. 4. The structure of the cantilever beam 21 is a laminated structure, which comprises an infrared absorptive layer 211, a first thermal deformed layer 212 and a second thermal deformed layer 213 successively. In order to improve infrared absorption, the area (width) of the infrared absorptive layer 211 should be as large as possible, the widths of the first thermal deformed layer 212 and the second thermal deformed layer 213 with relatively large thermal expansion coefficients should be as small as possible, the width of the infrared absorptive layer 211 is markedly larger than the width of either the first thermal deformed layer 212 or the second thermal deformed layer 213, so as to facilitate the deformation and sensitivity of the cantilever beam 21.

In the cantilever switch array 20, the first thermal deformed layer 212 and the second thermal deformed layer 213 in same cantilever beam 21 are formed respectively by thermal sensitive materials with different thermal expansion coefficients. Wherein, in the cantilever switch array 20, the thermal expansion coefficients of the first thermal deformed layers 212 in different cantilever beams 21 are different, and the thermal expansion coefficients of the second thermal deformed layers 213 in different cantilever beams 21 are different.

As shown in FIG. 5, in order to enhance infrared absorption, a reflective layer 25 is set under the cantilever switch array 20 on the surface of the semiconductor substrate.

The material of the infrared absorptive layer 211 is a dielectric material, such as silicon nitride, silicon oxynitride, silicon dioxide, etc.

The cantilever beams 21 and the metal layer 24 are fabricated by conventional CMOS technology such as deposition, photo lithography, etching and other process steps. The material of the thermal isolating layer 23 is as same as the cantilever beams 21, and the thermal isolating layer 23 is made synchronously with the cantilever beams 21.

The manufacture of the infrared sensor structure of present disclosure can be compatible with the existing semiconductor CMOS process.

As mentioned above, the present disclosure provides an infrared sensor structure, comprises a cantilever switch array, vertical heights from cantilever beams to switches are different from each other, when the cantilever beams are deformed by absorbing infrared signal, deformations of different cantilever beams are different from each other, with the deformation characteristic, the intensity of the infrared signal can be quantified by the conducting state of the switches, so as to realize the detection of the infrared signal.

While the present disclosure has been particularly shown and described with references to preferred embodiments thereof, if will be understood by those skilled in the art that various changes in form and details may be made herein without departing from the spirit and scope of the present disclosure as defined by the appended claims.

What is claimed is:

1. An infrared sensor structure, comprises a cantilever switch array, the cantilever switch array comprises cantilever switches, and each cantilever switch comprises a cantilever beam and a switch corresponding to the cantilever beam, vertical heights from the cantilever beams to the switches in different cantilever switches are different from each other, wherein the cantilever beams are configured to turn the switches on when the cantilever beams deform and connect to the switches; wherein, deformations of different cantilever beams produced by absorbing infrared radiation corresponding to an infrared signal are different from each other, the intensity of the infrared signal can be quantified by number of the switches turned on; wherein in the cantilever switch array, the vertical heights from the cantilever beams to the corresponding switches are set to increase or decrease successively.

2. The infrared sensor structure of claim 1, wherein the switch is a metal switch or a CMOS switch, and the end of the cantilever beam comprises a metal for controlling the switch.

3. The infrared sensor structure of claim 1, wherein the cantilever switch array is built on a semiconductor substrate, the switch is set on the surface of the semiconductor substrate, and each cantilever beam is horizontally connected to side of a supporting column arranged on the surface of the semiconductor substrate.

4. The infrared sensor structure of claim 3, wherein the cantilever beam comprises a metal layer, and the metal layer is separated from the switch, a pressure-controlled heat sink is set on the semiconductor substrate, the pressure-controlled heat sink is connected to the metal layer and controlled by a voltage for dissipating heat generated on the cantilever beam.

5. The infrared sensor structure of claim 3, wherein the material of the supporting column is a dielectric material.

6. The infrared sensor structure of claim 1, wherein the cantilever beam comprises a thermal isolating layer, wherein the thermal isolating layer is set between one end of the cantilever beam and a supporting column, and the thermal isolating layer is also set between the other end of the cantilever beam and the switch.

7. The infrared sensor structure of claim 1, wherein the structure of the cantilever beam is laminated structure, and the cantilever beam comprises an infrared absorptive layer, a first thermal deformed layer and a second thermal deformed layer; wherein, the width of the infrared absorptive layer is larger than the width of either the first thermal deformed layer or the second thermal deformed layer.

8. The infrared sensor structure of claim 7, wherein in the cantilever switch array, the material of the infrared absorptive layer is a dielectric material; the materials of the first thermal deformed layer and the second thermal deformed layer in same cantilever beam are thermal sensitive materials with different thermal expansion coefficients; the thermal expansion coefficients of the first thermal deformed layers in different cantilever beams are different, and the thermal expansion coefficients of the second thermal deformed layers in different cantilever beams are different.

9. The infrared sensor structure of claim 1, wherein in the cantilever switch array, when the vertical heights from the cantilever beams to the corresponding switches are set to increase successively, the thermal expansion coefficients of the materials of the cantilever beams increase successively; when the vertical heights from the cantilever beams to the corresponding switches are set to decrease successively, the thermal expansion coefficients of the materials of the cantilever beams decrease successively.

* * * * *